(12) United States Patent
Shiokawa

(10) Patent No.: US 11,942,184 B2
(45) Date of Patent: Mar. 26, 2024

(54) PROGRAMMABLE LOGIC CIRCUIT, INFORMATION PROCESSING APPARATUS, AND NON-TRANSITORY COMPUTER READABLE MEDIUM

(71) Applicant: FUJIFILM Business Innovation Corp., Tokyo (JP)

(72) Inventor: Hiroaki Shiokawa, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 300 days.

(21) Appl. No.: 17/334,811

(22) Filed: May 31, 2021

(65) Prior Publication Data

US 2022/0101897 A1 Mar. 31, 2022

(30) Foreign Application Priority Data

Sep. 29, 2020 (JP) ................................ 2020-163989

(51) Int. Cl.
*G11C 7/22* (2006.01)
*G11C 7/10* (2006.01)
*H03K 19/1776* (2020.01)
*H03K 19/20* (2006.01)

(52) U.S. Cl.
CPC ............ *G11C 7/222* (2013.01); *G11C 7/1051* (2013.01); *G11C 7/1078* (2013.01); *H03K 19/1776* (2013.01); *H03K 19/20* (2013.01)

(58) Field of Classification Search
CPC ..... G11C 7/222; G11C 7/1051; G11C 7/1078; H03K 19/1776; H03K 19/20
USPC ....................................................... 365/233.1
See application file for complete search history.

(56) References Cited

U.S. PATENT DOCUMENTS

| | | | |
|---|---|---|---|
| 5,892,981 A | 4/1999 | Wiggers | |
| 7,940,598 B2* | 5/2011 | Kasamsetty | G11C 7/1018 365/230.03 |
| 10,050,627 B2 | 8/2018 | Yin et al. | |
| 10,884,829 B1* | 1/2021 | Issa | G06F 12/0207 |
| 2005/0257120 A1* | 11/2005 | Gorobets | G06F 11/1008 714/763 |
| 2012/0047299 A1* | 2/2012 | Sasaki | G06F 13/362 710/244 |
| 2015/0235677 A1* | 8/2015 | Grunzke | G11C 5/04 365/226 |
| 2021/0375351 A1* | 12/2021 | Shaeffer | G11C 11/4091 |

FOREIGN PATENT DOCUMENTS

| | | | | |
|---|---|---|---|---|
| CN | 107093447 A | * | 8/2017 | ......... G11C 11/4076 |
| EP | 3015931 A1 | * | 5/2016 | ............ G05B 19/05 |
| JP | 2005258617 | | 9/2005 | |
| JP | 3860842 | | 12/2006 | |
| JP | 2018101359 | | 6/2018 | |

* cited by examiner

Primary Examiner — Fernando Hidalgo
(74) Attorney, Agent, or Firm — JCIPRNET

(57) ABSTRACT

A programmable logic circuit includes multiple logic blocks that are connected communicatively, wherein multiple modules are reconfigured in any of the logic blocks, and wherein the modules include a first module that is being executed and a second module that is not being executed, and start of execution of the second module is delayed from a start time point of execution of the first module so as to obtain a state in which a first time at which the first module accesses a memory does not overlap a second time at which the second module accesses the memory.

20 Claims, 12 Drawing Sheets

FIG. 2

| MODULE ID | DATA |
|---|---|
| M1 | ... |
| M2 | ... |
| M3 | ... |
| M4 | ... |
| ... | ... |

| SECOND MODULE ID | M4 / FIRST MODULE | | | | INITIAL DELAY TIME |
|---|---|---|---|---|---|
| | M1 | M2 | M3 | ... | |
| M1 | | | | | |
| M2 | y | y | n | ... | T12 |
| M3 | y | n | y | ... | T13 |
| M4 | n | y | y | ... | T23 |
| ... | y | y | y | ... | T123 |
| | ... | ... | ... | ... | ... |

1221  1222

| PROGRAM ID | MODULE USED | DATA |
|---|---|---|
| P1 | M1 | ... |
| P2 | M2, M3 | ... |
| P3 | M1, M3 | ... |
| ... | ... | ... |

123

| PRIORITY | AREA ID |
|---|---|
| 1 | R1a |
| 2 | R1b |
| 3 | R1c |
| 4 | R1d |
| ... | ... |

124

| COMBINATION | | | | INITIAL DELAY TIME |
|---|---|---|---|---|
| M1 | M2 | M3 | ... | |
| y | y | n | ... | T12 |
| y | n | y | ... | T13 |
| n | y | y | ... | T23 |
| ... | ... | ... | ... | ... |

122a

PROGRAMMABLE LOGIC CIRCUIT, INFORMATION PROCESSING APPARATUS, AND NON-TRANSITORY COMPUTER READABLE MEDIUM

CROSS-REFERENCE TO RELATED APPLICATIONS

This application is based on and claims priority under 35 USC 119 from Japanese Patent Application No. 2020-163989 filed Sep. 29, 2020.

BACKGROUND

(i) Technical Field

The present disclosure relates to a programmable logic circuit, an information processing apparatus, and a non-transitory computer readable medium.

(ii) Related Art

In programmable logic circuits, simultaneous access to a memory shared by multiple modules may cause processes to be delayed. For example, Japanese Unexamined Patent Application Publication No. 2005-258617 discusses measurement of a memory conflict time, and discloses a memory-conflict-time measurement apparatus which measures a memory conflict time correctly. Japanese Patent No. 3860842 discloses a digital memory system. The digital memory system measures the maximum delay time from the maximum number of clock pulses which are necessary for a reply and which are determined for at least two memory devices, and delays data output in response to the maximum delay time. Japanese Unexamined Patent Application Publication No. 2018-101359 discloses an information processing apparatus. The information processing apparatus obtains measurement values of the data transfer rates of multiple logic circuits that are reconfigured in a reconfiguration area and that are operating, and increases the parallelism of each logic circuit, which is reconfigured in the reconfiguration area, within a range in which the sum of the obtained data transfer rates does not exceed the upper limit of the data transfer rate of a bus of the programmable logic circuit device.

SUMMARY

Aspects of non-limiting embodiments of the present disclosure relate to a technique of distributing times at which multiple modules reconfigured in a programmable logic circuit access a shared memory.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a programmable logic circuit comprising: a plurality of logic blocks that are connected communicatively, wherein a plurality of modules are reconfigured in any of the plurality of logic blocks, and wherein the plurality of modules include a first module that is being executed and a second module that is not being executed, and start of execution of the second module is delayed from a start time point of execution of the first module so as to obtain a state in which a first time at which the first module accesses a memory does not overlap a second time at which the second module accesses the memory.

BRIEF DESCRIPTION OF THE DRAWINGS

Exemplary embodiment of the present disclosure will be described in detail based on the following figures, wherein:

FIG. 2 is a diagram illustrating an exemplary module database (DB);

FIG. 3 is a diagram illustrating an exemplary delay time DB;

DETAILED DESCRIPTION

Exemplary Embodiment

Configuration of an Information Processing System

Figure 1:
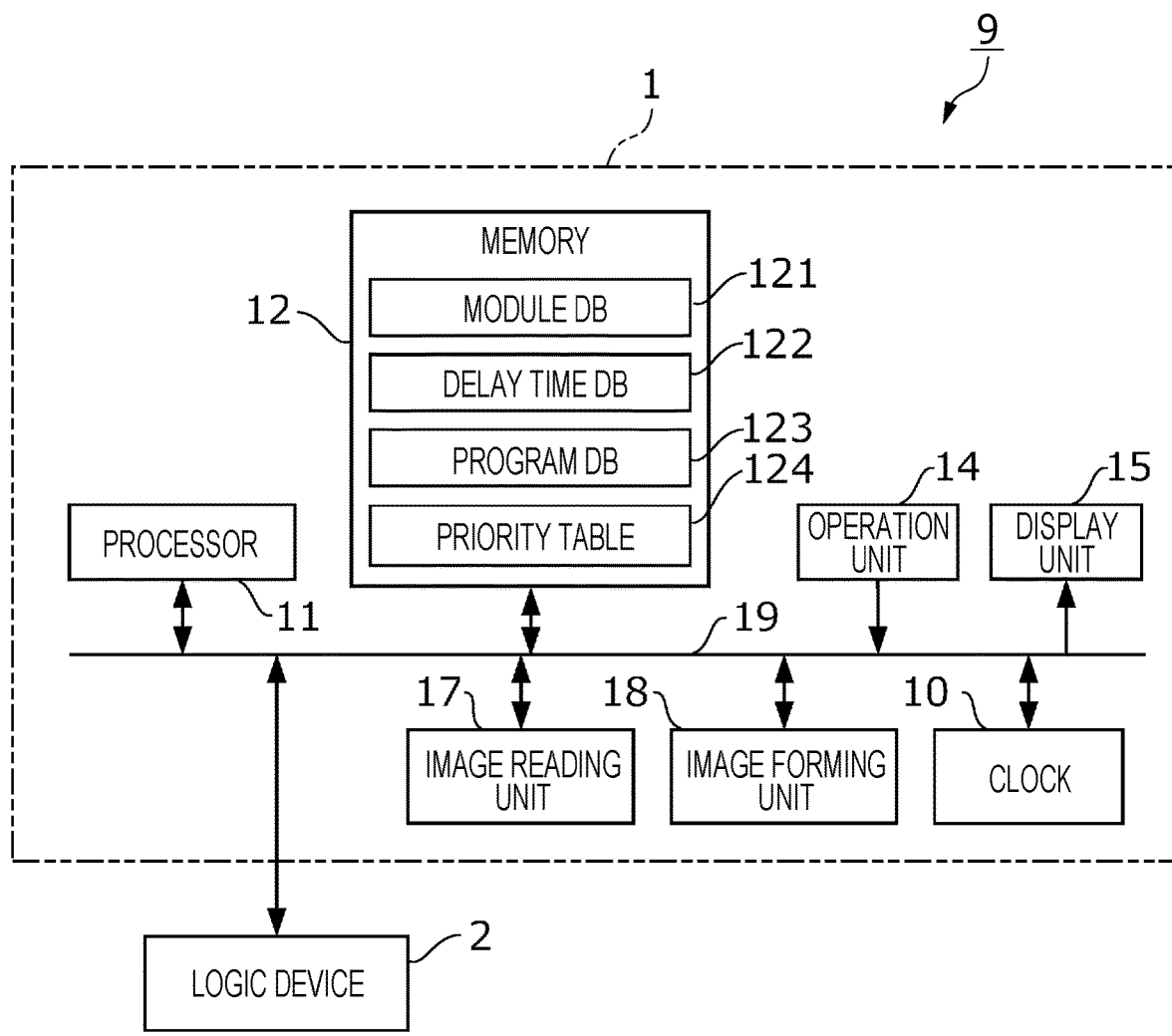
FIG. 1 is a diagram illustrating an exemplary configuration of an information processing system.

FIG. 1 is a diagram illustrating an exemplary configuration of an information processing system 9. The information processing system 9 illustrated in FIG. 1 includes an information processing apparatus 1 and a logic device 2. The information processing apparatus 1 is, for example, an apparatus which processes information, such as image data indicating images, various computer programs (hereinafter referred to simply as programs), and modules. The information processing apparatus 1 controls the logic device 2 and instructs the logic device 2 to perform processes. Under control of the information processing apparatus 1, the logic device 2 reconfigures its internal circuits and performs requested processes.

The information processing apparatus 1 includes a clock 10, a processor 11, a memory 12, an operation unit 14, a display unit 15, an image reading unit 17, and an image forming unit 18. These configurations are connected to each other through a bus 19 communicatively. The logic device 2 is connected to the bus 19, and is capable of communicating with the configurations in the information processing apparatus 1.

The bus 19 includes a host bus connecting the processor 11 to a chipset (not illustrated), and a memory bus connecting the memory 12 to a memory controller (not illustrated) included in the chipset. The bus 19 also includes a Peripheral Component Interconnect (PCI) bus connecting the processor 11 to the logic device 2 and the like, and a host/PCI bus bridge connecting the PCI bus to the host bus described above. The bus 19 may include an image bus which is used by the image reading unit 17 and the image forming unit 18 to exchange image data.

The clock 10, which supplies a clock signal to the processor 11 or the logic device 2, includes, for example, an oscillation circuit using a quartz resonator.

The processor 11 reads, for execution, programs, which are stored in the memory 12, so as to control the units of the information processing apparatus 1. The processor 11 is, for example, a central processing unit (CPU).

The operation unit 14 includes operators, such as operation buttons, a keyboard, a mouse, and a touch panel, for transmitting various instructions, and receives operations and transmits, to the processor 11, signals in accordance with the operations.

The display unit 15 displays a specified image under control of the processor 11 or the logic device 2. The display unit 15 illustrated in FIG. 1 includes a liquid-crystal display which is a display screen for displaying the image. A transparent touch panel of the operation unit 14 may be disposed so as to overlie the liquid-crystal display.

The image reading unit 17 includes an irradiation device such as a light emitting diode (LED), an optical system, such as a lens and a prism, and an imaging device, such as a complementary metal oxide semiconductor (CMOS) image sensor or a charge coupled device (CCD) image sensor. Under control of the processor 11 or the logic device 2, the image reading unit 17 reads an image formed on a medium such as paper, generates image data indicating the read image, and supplies the image data to the processor 11.

Under control of the processor 11 or the logic device 2, the image forming unit 18 forms an image on a medium such as paper, for example, by using an electrophotographic system.

The memory 12 is a storage unit which stores an operating system, various programs, data, and the like which are read by the processor 11. In the memory 12, modules supplied to the logic device 2 are stored. The memory 12 includes a random access memory (RAM) and a read only memory (ROM). The memory 12 may also include a solid state drive and a hard disk drive. In the memory 12, a module DB 121, a delay time DB 122, a program DB 123, and a priority table 124 are stored.

FIG. 2 is a diagram illustrating an exemplary module DB 121. In the module DB 121, the module ID field stores a "module ID", per cell, which is identification information which identifies such a module described above. The data field stores data (also referred to as configuration data), per cell, which is used in reconfiguring, in the logic device 2, a module identified with the corresponding module ID. In the module DB 121 illustrated in FIG. 2, a single module is constituted by a single piece of configuration data.

FIG. 3 is a diagram illustrating an exemplary delay time DB 122. The delay time DB 122 illustrated in FIG. 3 includes a second-module ID list 1221 and a delay time table 1222. The second-module ID list 1221 lists module IDs (also referred to as second module IDs), each of which is identification information of a module (referred to as a second module) whose execution is started during execution of different modules (referred to as first modules).

The delay time table 1222 is a table provided for each second module ID listed in the second-module ID list 1221. The delay time table 1222 stores initial values (referred to as initial delay times) of times (referred to as delay times) by which start of execution of the second module identified with the corresponding second module ID is delayed. The initial delay time is predetermined in accordance with a combination of one or more first modules which are already being executed.

The processor 11 refers to the delay time DB 122 illustrated in FIG. 3, and informs the logic device 2, in which the first modules and the second module have been reconfigured, of the initial delay time. A programmable logic circuit 21 of the logic device 2, which will be described below, delays start of execution of the second module in accordance with the informed initial delay time from the time point (referred to as the start time point) of start of execution of any of the one or more first modules. For example, the programmable logic circuit 21 starts execution of the second module with a delay of the initial delay time from the latest time point among the start time points of the one or more first modules.

That is, the programmable logic circuit 21 of the logic device 2 is an exemplary programmable logic circuit which, in accordance with a combination of one or more first modules and a second module, delays start of execution of the second module from the start time point of execution of any of the one or more first modules.

Figures 4, 5, 6:
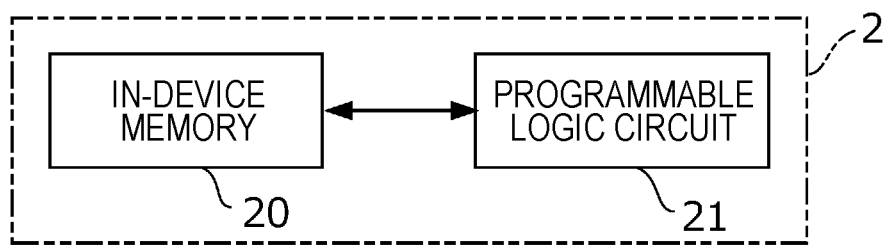
FIG. 4 is a diagram illustrating an exemplary program DB.
FIG. 5 is a diagram illustrating an exemplary priority table.
FIG. 6 is a diagram illustrating an exemplary configuration of a logic device.

FIG. 4 is a diagram illustrating an exemplary program DB 123. The program DB 123 illustrated in FIG. 4 stores program IDs, modules used, and data in association with each other. The program ID field in FIG. 4 stores identification information of a program, per cell, which may be specified by the information processing apparatus 1. The module-used field in FIG. 4 stores identification information of one or more modules, per cell, which are used in the program identified with the corresponding program ID. The data field in FIG. 4 indicates data describing the program itself identified with the corresponding program ID.

FIG. 5 is a diagram illustrating an exemplary priority table 124. The priority table 124 defines which module has a higher priority in the case where two or more modules, which are executed in parallel in the logic device 2, access a common memory with a conflict. The priority table 124 illustrated in FIG. 5 stores the IDs of areas, in which modules are reconfigured, in association with priority in memory access. For example, the priority table 124 in FIG. 5 defines that memory access of modules, which have been reconfigured in the areas identified with the corresponding area IDs, is prioritized in the following sequence of the area IDs: "R1*a*", "R1*b*", "R1*c*", and "R1*d*".

The logic device 2 is a logic circuit which is capable of, under control of the processor 11, reconfiguring modules which implement functions, and is, for example, a field programmable gate array (FPGA). The logic device 2 illustrated in FIG. 1 controls at least one of the units, the display unit 15, the image reading unit 17, and the image forming unit 18. The targets of control of the logic device 2 are not limited to these. Alternatively, the logic device 2 does not necessarily control these.

Configuration of the Logic Device

FIG. 6 is a diagram illustrating an exemplary configuration of the logic device 2. The logic device 2 illustrated in FIG. 6 includes an in-device memory 20 and the programmable logic circuit 21. The in-device memory 20 illustrated in FIG. 6 is a storage device built in the logic device 2, and is, for example, a double-data-rate synchronous dynamic random access memory (DDR SDRAM). The programmable logic circuit 21 illustrated in FIG. 6 is a semiconductor chip which is capable of reconfiguring the structure of its internal logic circuit.

Figure 7:
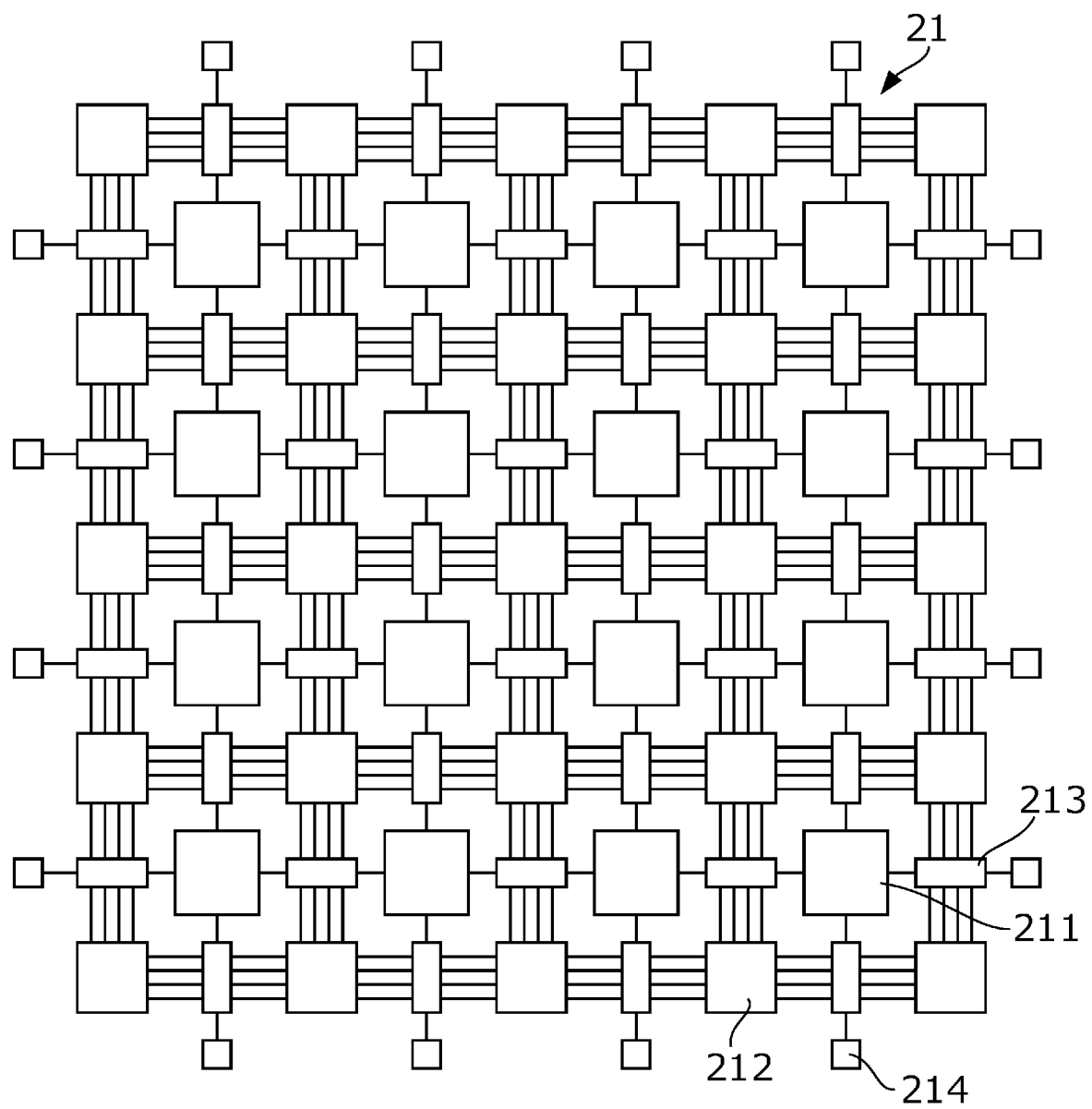
FIG. 7 is a diagram illustrating an exemplary configuration of a programmable logic circuit according to the present exemplary embodiment.

FIG. 7 is a diagram illustrating an exemplary configuration of the programmable logic circuit 21 according to the present exemplary embodiment. The programmable logic circuit 21 illustrated in FIG. 7 is a so-called island-style FPGA.

The programmable logic circuit 21 includes multiple logic blocks 211, switch blocks 212, connection blocks 213, and input/output terminals 214 which are arrayed in a grid. That is, the programmable logic circuit 21 is an exemplary programmable logic circuit having multiple logic blocks arrayed in a grid. The programmable logic circuit 21 illustrated in FIG. 7 is schematic. The number of logic blocks 211 and the like is not limited to that illustrated in FIG. 7.

The logic blocks 211 serve as units, of which modules for implementing various functions, such as logic or arithmetic circuits and memory circuits, are formed by using a truth table circuit or the like.

The switch blocks 212 and the connection blocks 213 along with wires, which connect these, form a wiring area.

The switch blocks 212 switch connection between wires. The connection blocks 213 switch connection between input/output of the logic blocks 211 and the wiring area.

The switch blocks 212 and the connection blocks 213 are formed, for example, of switches using bus transistors and configuration memories for controlling the switches.

The input/output terminals 214 connect the programmable logic circuit 21 to the processor 11 communicatively, and serve as interfaces of input from the processor 11 and output to the processor 11.

Any of the input/output terminals 214 is connected to the in-device memory 20, and relays access to the in-device memory 20 which is requested from the modules reconfigured in the programmable logic circuit 21. The input/output terminals 214 illustrated in FIG. 7 are connected to the wiring area.

The programmable logic circuit 21 may include, for example, a digital signal processor (DSP) used in execution of a determined process.

The processor 11 writes configuration data, which is stored in the memory 12, in the logic blocks 211, the switch blocks 212, and the connection blocks 213 of the programmable logic circuit 21 so as to reconfigure the programmable logic circuit 21.

Figure 8:
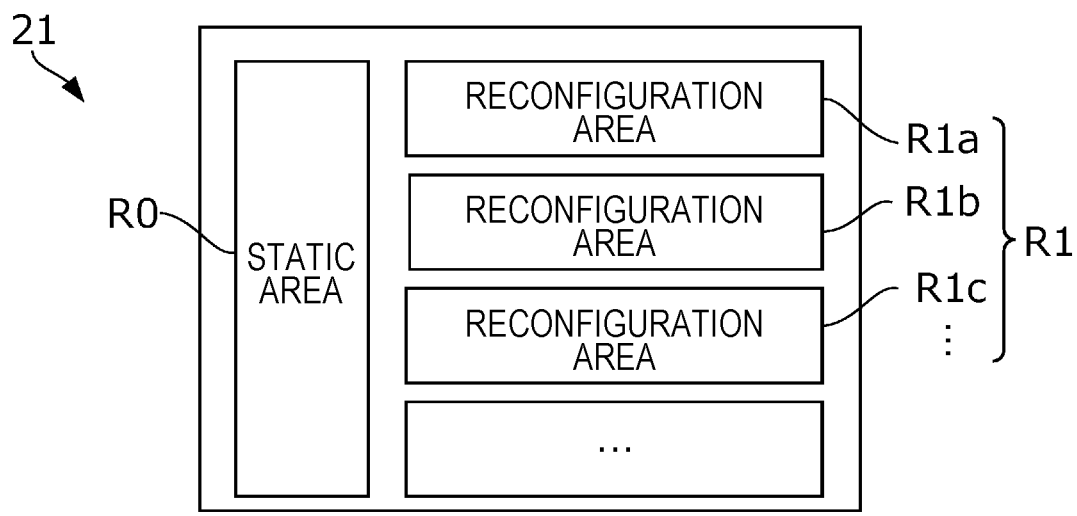
FIG. 8 is a diagram illustrating an example of the area of a programmable logic circuit.

FIG. 8 is a diagram illustrating an example of the area of the programmable logic circuit 21. As illustrated in FIG. 8, the programmable logic circuit 21 segments the logic blocks 211, which are arrayed in a grid, into multiple areas in accordance with the positions of the logic blocks 211. The programmable logic circuit 21 illustrated in FIG. 8 includes at least one static area R0, multiple reconfiguration areas R1a, R1b, R1c, . . . . When the reconfiguration areas R1a, R1b, R1c, . . . are not necessarily distinguished, they are denoted as reconfiguration areas R1.

The static area R0 is reconfigured at start-up at which power supply to the information processing apparatus 1 starts. In the static area R0, for example, frequently called modules and memories, in which data that is commonly referenced to across modules is stored, are reconfigured at start-up.

The reconfiguration areas R1 are reconfigured when the processor 11 requests the reconfiguration. In each of the reconfiguration areas R1, a single module is reconfigured.

Figure 9:
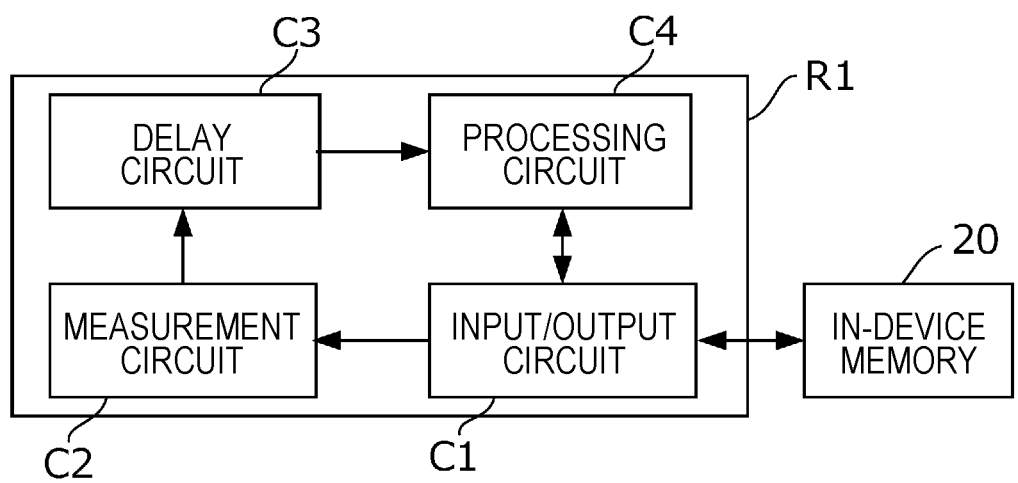
FIG. 9 is a diagram for describing circuits included in a reconfigured module.

FIG. 9 is a diagram for describing circuits included in a reconfigured module. In the single reconfiguration area R1 illustrated in FIG. 9, an input/output circuit C1, a measurement circuit C2, a delay circuit C3, and a processing circuit C4 which are included in the module are reconfigured.

The processing circuit C4 performs a given process. Examples of the "given process" include a rotation calculation process of rotating, by a specified angle, image data which indicates an image, an image sharpening process of adjusting the gradation of each pixel so as to sharpen the image, and an edge detecting process of detecting the shape of an object from an image.

The input/output circuit C1 inputs/outputs data, which is used by the processing circuit C4, from/to the in-device memory 20. The input/output circuit C1 is reconfigured on the basis of the configuration data of a module and the priority read from the priority table 124. Thus, when times of memory access made by multiple modules conflict with each other, the input/output circuit C1 uses the priority of the areas, in which the modules are reconfigured, to transmit a wait instruction and arbitrate memory access.

The measurement circuit C2 measures a time (referred to as a waiting time) in which a different module causes the input/output circuit C1 to wait to input/output data.

The delay circuit C3 delays start of a process, which is performed by the processing circuit C4, in accordance with the waiting time measured by the measurement circuit C2. The delay circuit C3 is reconfigured on the basis of the configuration data of the module and the initial delay time read from the delay time DB 122. Thus, when the processing circuit C4 performs a process for the first time after a start-up, the delay circuit C3 delays the execution on the basis of the initial delay time.

That is, the programmable logic circuit 21, in which modules having the input/output circuits C1, the measurement circuits C2, the delay circuits C3, and the processing circuits C4 are reconfigured, is an exemplary programmable logic circuit including a processing circuit that performs a given process, an input/output circuit that inputs/outputs, from/to a memory, data used by the processing circuit, a measurement circuit that measures a waiting time in which a first module causes the input/output circuit to wait to input/output data, and a delay circuit that delays start of a process, which is performed by the processing circuit, in accordance with the waiting time measured by the measurement circuit.

The module reconfigured in the reconfiguration area R1 illustrated in FIG. 9 uses the input/output circuit C1 to read data from the in-device memory 20, and supplies the data to the processing circuit C4. The measurement circuit C2 monitors the input/output circuit C1 to measure the waiting time, and transmits the result to the delay circuit C3.

The delay circuit C3 predicts a time, at which the input/output circuit C1 is to access the in-device memory 20 next time, in accordance with the measured waiting time, and determines a time, at which the processing circuit C4 is to start execution of the process next time, in accordance with the result. The time is obtained by calculating the delay time from the time of start of a different module which is being executed. That is, the delay circuit C3 is an exemplary delay circuit that calculates a delay time, by which start of the process performed by the processing circuit is to be delayed, in accordance with the waiting time.

The processing circuit C4 delays execution of the process until the time determined by the delay circuit C3 comes. When the processing circuit C4 ends the process, the input/output circuit C1 writes the result of the process in the in-device memory 20.

Figure 10:
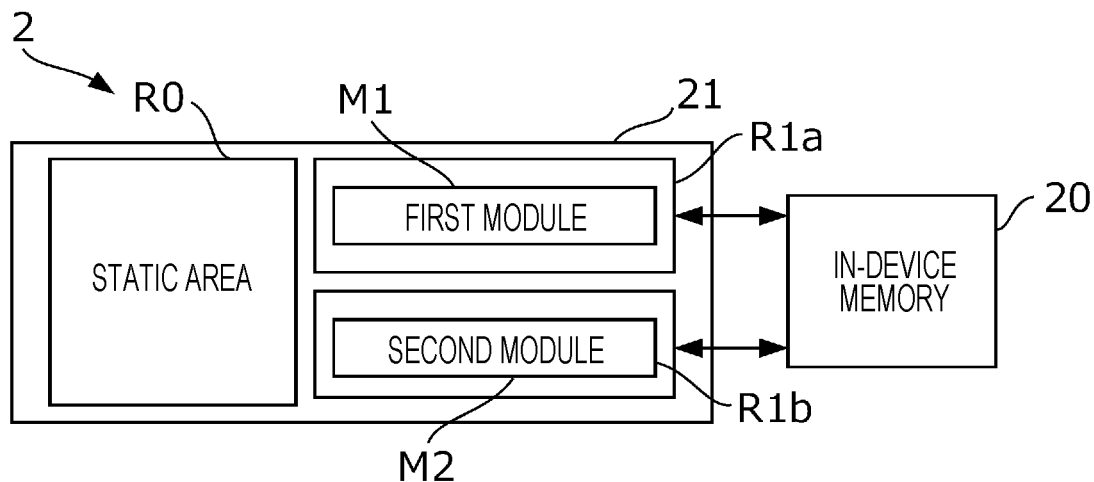
FIG. 10 is a diagram illustrating an exemplary logic device in which two processes are performed in parallel.

FIG. 10 is a diagram illustrating an exemplary logic device 2 in which two processes are performed in parallel. In the programmable logic circuit 21 of the logic device 2 illustrated in FIG. 10, a first module M1 is reconfigured in the reconfiguration area R1*a*, and a second module M2 is reconfigured in the reconfiguration area R1*b*. In the logic device 2 illustrated in FIG. 10, the process of the first module M1 starts first, and the process of the second module M2 then starts. Both the first module M1 and the second module M2 access the in-device memory 20 which is a common storage device.

Functional Configuration of the Processor

Figure 11:
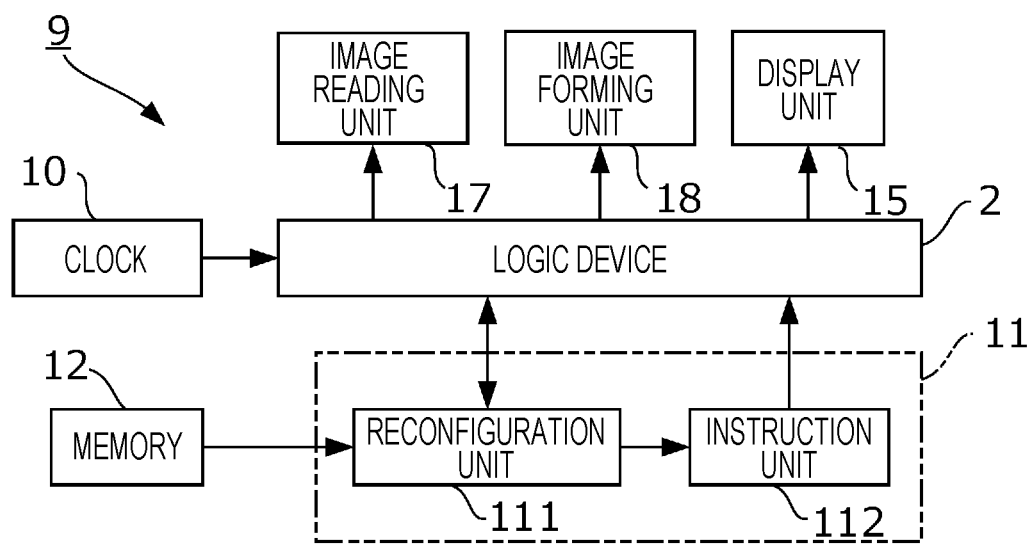
FIG. 11 is a diagram illustrating an exemplary functional configuration of a processor.

FIG. 11 is a diagram illustrating an exemplary functional configuration of the processor 11. The processor 11 of the information processing apparatus 1 executes programs stored in the memory 12, functioning as a reconfiguration unit 111 and an instruction unit 112.

The reconfiguration unit 111 reads configuration data from the memory 12, writes the configuration data in any of the areas in the programmable logic circuit 21 of the logic device 2, and reconfigures the module.

Upon completion of reconfiguration performed by the reconfiguration unit 111, the instruction unit 112 instructs circuits, which implement the reconfigured module, to perform a process. When the processor 11 in FIG. 11 transmits instructions, in parallel, to perform the processes of multiple modules, the processor 11 does not arbitrate access of the modules to the in-device memory 20. The programmable logic circuit 21 performs this arbitration.

Operations of the Information Processing Apparatus

Figure 12:
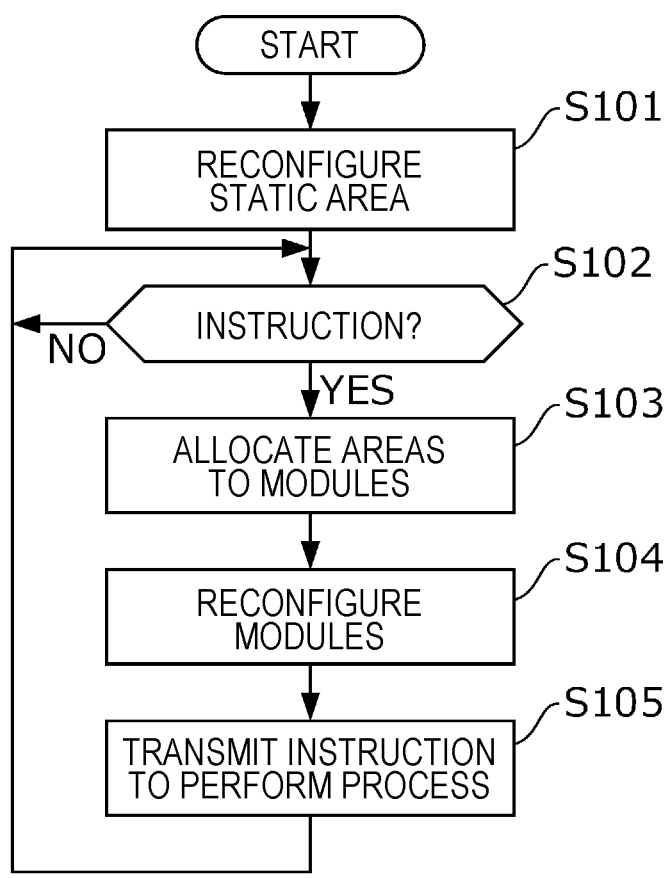
FIG. 12 is a flowchart of an exemplary operation of a processor.

FIG. 12 is a flowchart of an exemplary operation of the processor 11. When the information processing apparatus 1 is started, the processor 11 controls the logic device 2 through the bus 19 to reconfigure the static area R0 of the programmable logic circuit 21 (step S101). This reconfiguration is performed only once at start-up.

The processor 11 monitors the operation unit 14, and determines whether a user has transmitted an instruction to execute a selected program (step S102). While the processor 11 determines that such an instruction has not been transmitted from a user (NO in step S102), the processor 11 continues to perform the determination.

If the processor 11 determines that a user has transmitted such an instruction (YES in step S102), the processor 11 refers to the program DB 123 to specify the module IDs of the modules, which are used in the program, from the program ID which is identification information of the specified program, and allocates areas in the programmable logic circuit 21 to the modules (step S103).

The processor 11 reconfigures the modules in the allocated areas (step S104), and instructs the logic device 2 to perform the process (step S105). Upon completion of the logic device 2's execution of the process, the processor 11 causes the process to return to step S102.

Operations of the Logic Device

Figure 13:
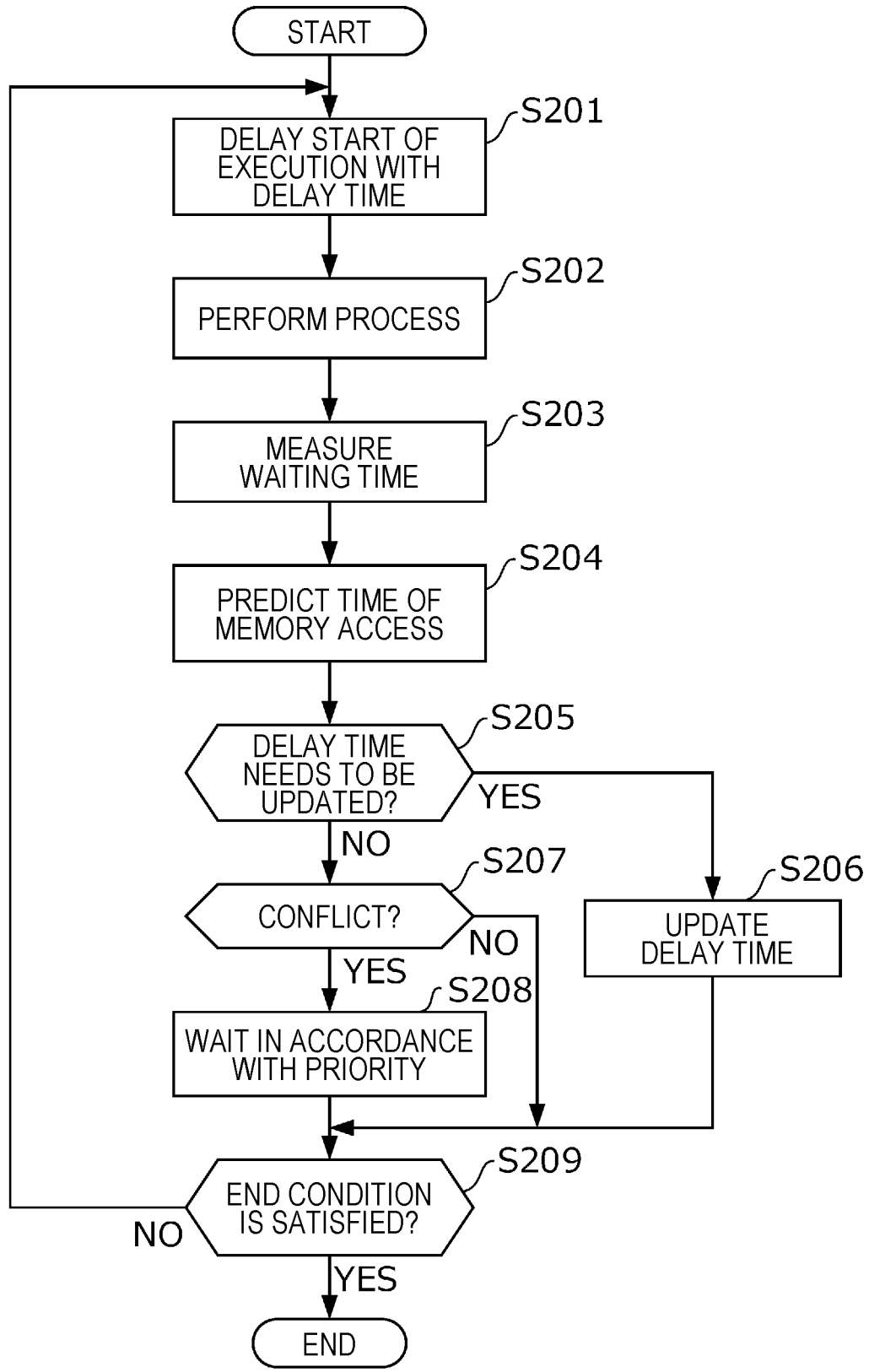
FIG. 13 is a flowchart of an exemplary operation of a logic device.

FIG. 13 is a flowchart of an exemplary operation of the logic device 2. When an instruction to perform a process is received from the processor 11 of the information processing apparatus 1, the programmable logic circuit 21 of the logic device 2 delays start of execution in accordance with the determined delay time for each of the one or more reconfigured modules (step S201), and then performs the process (step S202).

In response to access of the input/output circuit C1 to the in-device memory 20 in step S202, the measurement circuit C2 of the programmable logic circuit 21 measures the waiting time (step S203). The delay circuit C3 uses the measured waiting time to predict the time of the next memory access (step S204).

This prediction may be performed parallel to memory access, or may be performed during waiting to do memory access. In the case where the time of the next memory access is predicted parallel to memory access, the module is being executed. In contrast, in the case where the time of the next memory access is predicted during waiting to do memory access, the module is not being executed.

On the basis of the prediction result, the delay circuit C3 of the programmable logic circuit 21 determines whether the delay time needs to be updated (step S205). For example, in the case where the time of the next memory access made by a module which is not being executed overlaps the time of the next memory access made by a module which is being executed, the programmable logic circuit 21 determines that the delay time needs to be updated. Two or more times overlapping each other indicate that the difference between the two or more times is less than a given threshold.

The programmable logic circuit 21 may determine that the delay time does not need to be updated after the number of calculations of the delay time for update is equal to or greater than a threshold. When it is determined that update is not needed, the programmable logic circuit 21 delays start of execution of the process by using the delay time which has been already used. Thus, update of the delay time has not met a threshold, achieving a stable operation of the information processing system.

In this case, the delay circuit C3 is an exemplary delay circuit that calculates the delay time, by which start of a process performed by a processing circuit is to be delayed, in accordance with a waiting time. After the number of calculations of the delay time is equal to or greater than the threshold, the delay circuit C3 does not calculate a new delay time, and delays start of the process by using the delay time which has been already calculated.

If it is determined that the delay time needs to be updated (YES in step S205), the delay circuit C3 updates the delay time written in the delay circuit C3 (step S206), and causes the process to proceed to step S209. In this case, the updated delay time is referred to by the programmable logic circuit 21 in the next execution of step S201, and start of execution of the module is delayed in accordance with the delay time.

That is, the programmable logic circuit 21 is an exemplary programmable logic circuit that includes multiple logic blocks connected communicatively. Multiple modules including a first module and a second module are reconfigured in any of the logic blocks. Start of execution of the second module among the multiple modules is delayed from the start time point of execution of the first module so that a first time, at which the first module which is being executed accesses a memory, does not overlap a second time at which the second module which is not being executed accesses the memory.

In contrast, if it is determined that the delay time does not need to be updated (NO in step S205), the processing circuit C4 of the programmable logic circuit 21 determines whether the time of access to the in-device memory 20 overlaps that of a different module and the access request conflicts with another request (step S207).

If it is determined that a conflict occurs (YES in step S207), the processing circuit C4 determines whether waiting is needed in accordance with the priority which is written in the processing circuit C4 on the basis of the priority table 124 in reconfiguration (step S208), and causes the process to proceed to step S209. For example, the processing circuit C4 refers to the priority table 124. When a higher priority than that of the module including the processing circuit C4 is assigned to the different module that is being executed, the processing circuit C4 makes the input/output circuit C1 wait until memory access made by the different module ends. After end of the memory access, the processing circuit C4 permits memory access of the input/output circuit C1.

In this case, the programmable logic circuit 21, in which the modules are reconfigured, is an exemplary programmable logic circuit in which, when, among the modules, any two or more modules conflict with each other in memory access, permits the two or more modules to access the memory in accordance with the priority assigned to the modules.

In contrast, if it is determined that a conflict does not occur (NO in step S207), the processing circuit C4 causes the process to proceed to step S209 without execution of step S208.

For example, the programmable logic circuit 21 determines whether an end condition, such as an interruption request from the processor 11 or end of calculation, is satisfied (step S209). If the end condition is satisfied, (YES in step S209), the programmable logic circuit 21 ends the process. In contrast, if it is determined that the end condition is not satisfied (NO in step S209), the programmable logic circuit 21 causes the process to return to step S201.

When the period of the process of each module does not influenced by disturbance or the like, and when the delay time which is the initial delay time does not need to be updated, the programmable logic circuit 21 does not necessarily predict the time of memory access in step S204. In this case, the programmable logic circuit 21 does not necessarily make the determination in step S205 and the step S207.

The Case of Modules Having the Same Period

Figure 14:
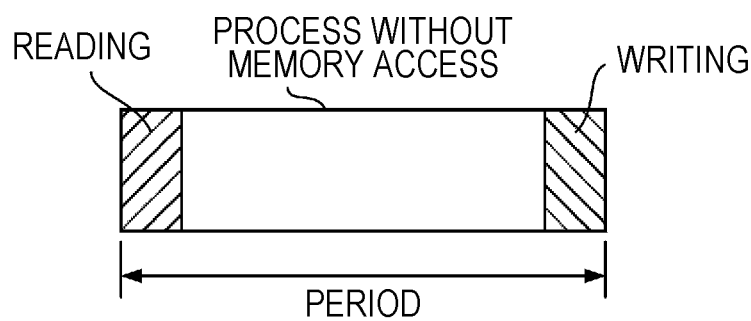
FIG. 14 is a diagram for describing the period of a process performed by a module.

In the operation described above, start of execution of a module is adjusted as follows. FIG. 14 is a diagram for describing the period of a module. In FIG. 14, the horizontal direction indicates the time which elapses from left to right. One period of the process of the module is formed of three stages, that is, reading, a process without memory access, and writing, which are performed in this sequence. In the area in the programmable logic circuit 21 in which the module is reconfigured, data which serves as an initial value is read from the in-device memory 20, and the read data is used to perform the process without memory access. Then, in the area, data indicating the result of the executed process is written in the in-device memory 20.

Figure 15A:
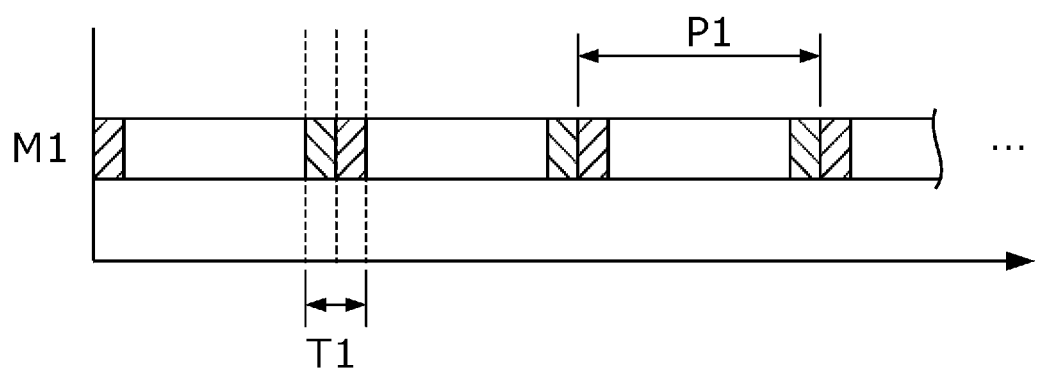
FIGS. 15A and 15B are diagrams for describing increase in memory access time due to conflicts.
Figure 15B:
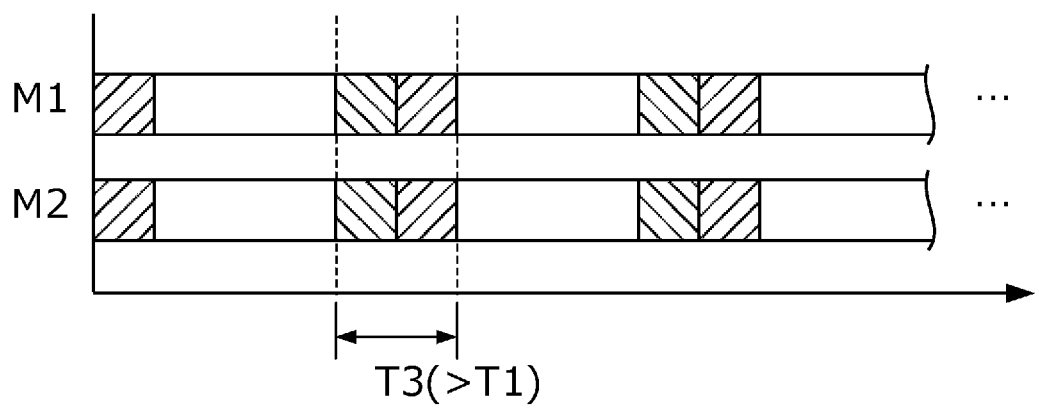

FIGS. 15A and 15B are diagrams for describing increase in memory access time due to conflicts. As illustrated in FIG. 15A, when the first module M1 repeatedly performs a process, having a period P1, alone in the programmable logic circuit 21, the reading and writing stages, that is, a time T1 necessary for memory access has a fixed length. This is because, without a struggle for access right to the in-device memory 20 with a different module, the time T1 reflects only the time spent for memory access itself.

In contrast, as illustrated in FIG. 15B, in the programmable logic circuit 21, for example, when the first module M1 and the second module M2 having the same period start at the same time, their times of memory access overlap each other. That is, the two modules conflict with each other in memory access. At that time, the in-device memory 20 fails to respond to an access request from the first module and that from the second module at the same time. Thus, the access commands are made to wait, and a time T3 necessary for both the memory accesses is longer than either of that in execution of the first module alone and that in execution of the second module alone (T3>T1).

Figure 16:
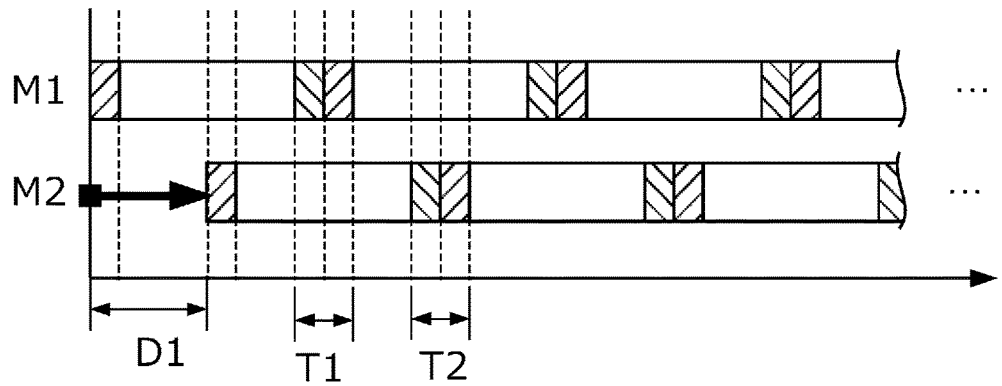
FIG. 16 is a diagram for describing a second module whose start of execution is delayed.

Therefore, the programmable logic circuit 21 delays the process of the second module M2 which starts during execution of the first module M1. FIG. 16 is a diagram for describing the second module M2 whose start of execution is delayed. For example, the programmable logic circuit 21 specifies the initial delay time in accordance with the combination of the second module M2 and the first module M1, and uses the initial delay time as the delay time D1 to delay start of execution of the second module M2 from start of execution of the first module M1.

This causes the time (referred to as a first time), at which the first module M1 accesses the in-device memory 20, not to overlap the time (referred to as a second time) at which the second module M2 accesses the in-device memory 20. Therefore, the time T1 necessary for memory access of the first module M1 is almost the same as the time necessary for memory access of the first module M1 alone. The time T2 necessary for memory access of the second module M2 is almost the same as the time necessary for memory access of the second module M2 alone.

The Case of a Module Having a Period which is an Integer Multiple of that of a Different Module In the programmable logic circuit 21, two or more modules, which are reconfigured and executed in parallel, may have different periods. However, assume the case in which the period of a first module is an integer multiple of that of a second module, and in which the time necessary for memory access of the second module is shorter than the time necessary for the process without memory access of the first module. In this case, start of execution of the first module is delayed. This may avoid a conflict in memory access.

Figure 17A:
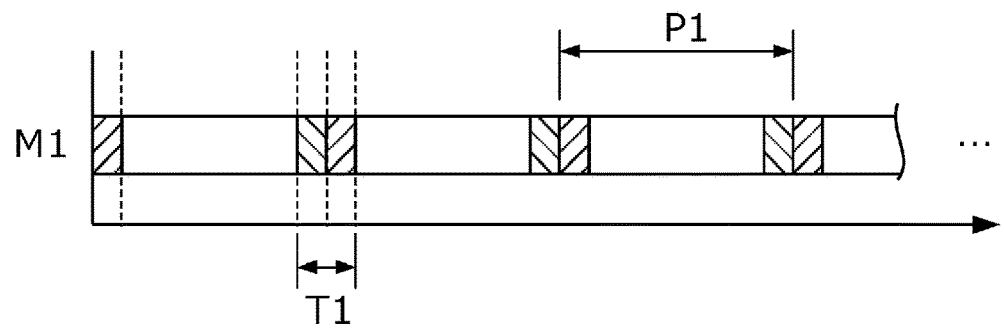
FIGS. 17A to 17C are diagrams for describing a module whose period is an integer multiple of that of another module.
Figure 17B:
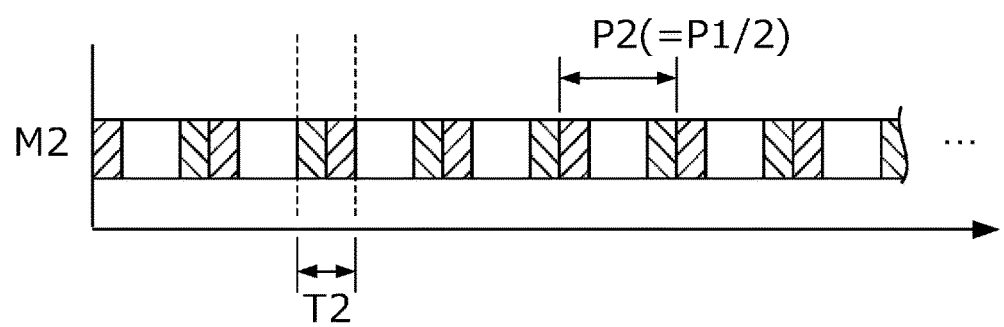
Figure 17C:
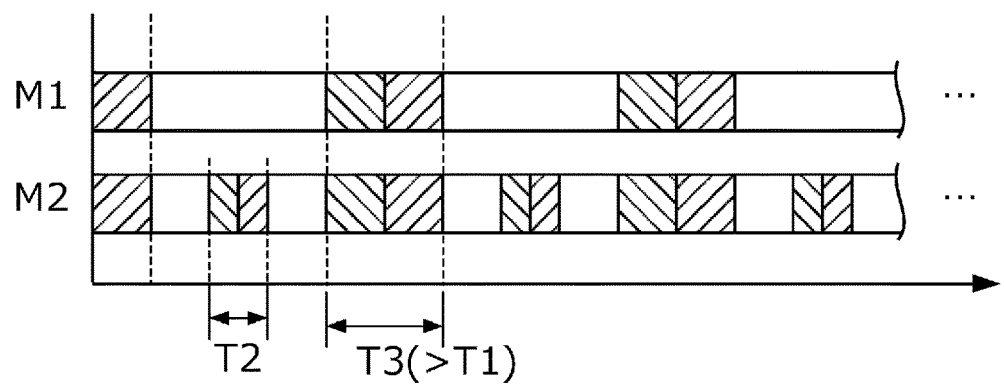

FIGS. 17A to 17C are diagrams for describing a module having a period which is an integer multiple of that of a different module. The first module M1 illustrated in FIG. 17A repeatedly performs a process having a period P1, and requires a time T1 for memory access.

The second module M2 illustrated in FIG. 17B repeatedly performs a process having a period P2, and requires a time T2 for memory access. The period P2 is half the period P1 (=P1/2). That is, the period P1 is twice as much as the period P2.

In this case, for example, when the first module M1 and the second module M2 start at the same time, as illustrated in FIG. 17C, when the number of iterations of the second module M2 is an even number, the second module M2 conflicts with the first module M1 in memory access. The time T3 necessary for memory access at that time is longer than either of the time T1 necessary for memory access of the first module M1 alone and the time T2 necessary for memory access of the second module M2 alone. As a result, the time necessary for the entire process is longer than either of the time for execution of the first module M1 alone and the time for execution of the second module M2 alone.

Figures 18, 19:
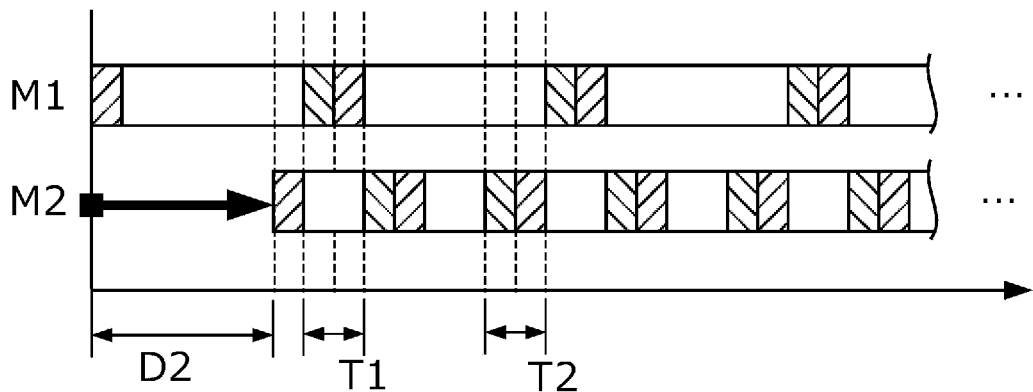
FIG. 18 is a diagram illustrating an example in which start of a module having an integer-multiple period is delayed.
FIG. 19 is a diagram illustrating an exemplary delay time DB according to a modified example.

FIG. 18 is a diagram illustrating an example in which start of execution is delayed for a module having an integer-multiple period. The programmable logic circuit 21 delays the start time point of the second module M2 by the delay time D2 relative to the start time point of the first module M1 having the period P1 twice as much as the period P2. Thus, a first time of memory access of the first module M1 is within a period of a process without memory access of the second module M2. A second time of memory access of the second module M2 is within a period of a process without memory access of the first module M1. That is, the first module M1 does not conflict with the second module M2 in memory access.

As described above, the delay time D1 and the delay time D2 are updated in accordance with the waiting time measured in the actual process. Thus, even when a delay with the initial delay time causes a conflict to occur in memory access, start of execution of the second module M2 is delayed so that the waiting time due to the conflict is made shorter.

According to the operation described above, the programmable logic circuit 21 of the logic device 2 distributes times at which multiple modules, which are reconfigured in the programmable logic circuit 21, access the shared in-device memory 20. As a result, occurrence of a waiting time due to a conflict in memory access is suppressed, improving the execution speed of the process in the logic device 2.

MODIFIED EXAMPLES

The exemplary embodiment is described above. However, the exemplary embodiment may be changed as described below. The modified examples described below may be combined with each other.

First Modified Example

In the embodiments above, the term "processor" refers to hardware in a broad sense. Examples of the processor include general processors (e.g., CPU) and dedicated processors (e.g., GPU: Graphics Processing Unit, ASIC: Application Specific Integrated Circuit, FPGA, and programmable logic device).

In the embodiments above, the term "processor" is broad enough to encompass one processor or plural processors in collaboration which are located physically apart from each other but may work cooperatively. The order of operations of the processor is not limited to one described in the embodiments above, and may be changed.

Second Modified Example

In the exemplary embodiment described above, the delay time DB 122 includes the second-module ID list 1221 and the delay time table 1222. Alternatively, the delay time DB 122 may have another configuration. For example, the delay time DB 122 may associate initial delay times with the respective combinations of two or more modules. FIG. 19 is a diagram illustrating an exemplary delay time DB 122*a* according to the second modified example. The delay time DB 122*a* illustrated in FIG. 19 stores initial delay times in association with the respective combinations of modules used in the program. In this case, for a module, which is included in a combination and which is not being executed, the initial delay time associated with this combination is used.

Third Modified Example

In the exemplary embodiment described above, the programmable logic circuit 21 reconfigures a module having the input/output circuit C1, the measurement circuit C2, the delay circuit C3, and the processing circuit C4. Alternatively, the functions of the measurement circuit C2, and the delay circuit C3 may be implemented by the processor 11.

Figure 20:
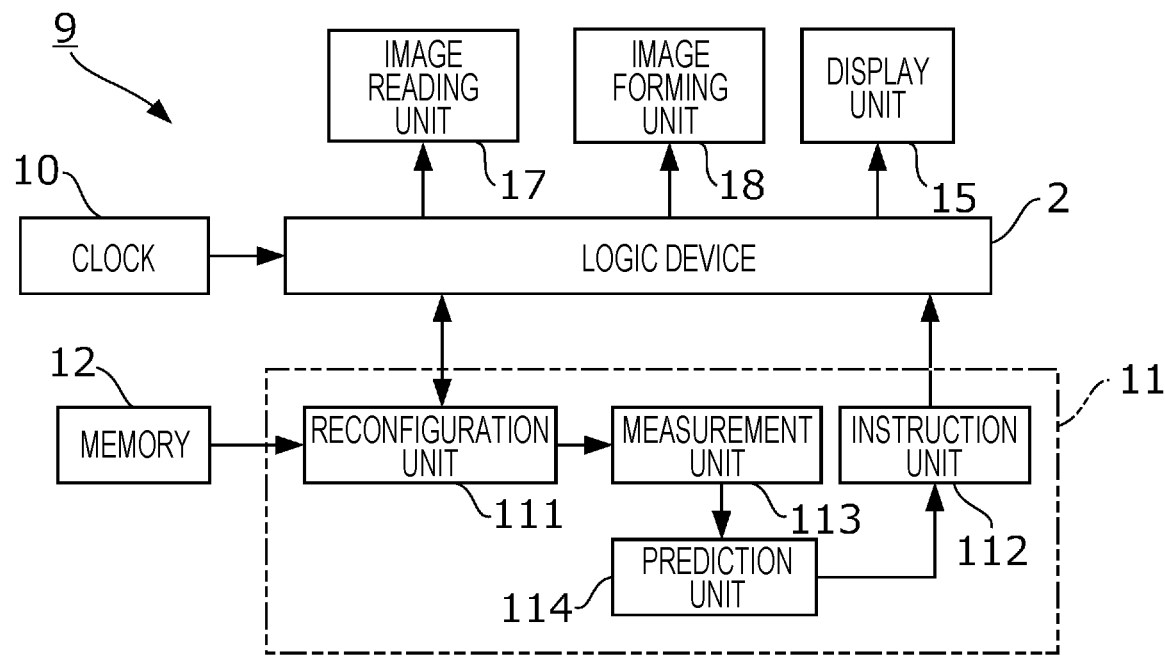
FIG. 20 is a diagram illustrating an exemplary functional configuration of a processor according to a modified example.

FIG. 20 is a diagram illustrating an exemplary functional configuration of the processor 11 according to the third modified example. The processor 11 functions as a measurement unit 113 and a prediction unit 114. The measurement unit 113 illustrated in FIG. 20 monitors the logic device 2, measures the waiting time of each of one or more modules reconfigured in the programmable logic circuit 21, and transmits the result to the prediction unit 114.

The prediction unit 114 predicts a first time of the next access to the in-device memory 20, which is made by a first module that is being executed, in accordance with the measured waiting time. The prediction unit 114 predicts a second time of the next access to the in-device memory 20, which is made by a second module that is not being executed, in accordance with the waiting time. The prediction unit 114 transmits the predicted first time and second time to the instruction unit 112.

The instruction unit 112 calculates a delay time used in start of execution of the process of the second module so that the predicted second time does not overlap the first time. The instruction unit 112 may instruct the programmable logic circuit 21 to delay start of execution of the process in accordance with the calculated delay time.

The processor 11 according to the third modified example is an exemplary processor that is connected to a programmable logic circuit, that reconfigures multiple modules in the programmable logic circuit, that predicts a first time of memory access made by a first module, which is being executed, among the modules, that predicts a second time of memory access made by a second module, which is not being executed, among the modules, and that delays start of execution of the second module from the start time point of execution of the first module so that the second time does not overlap the first time.

Fourth Modified Example

In the exemplary embodiment described above, the modules reconfigured in the programmable logic circuit 21 access the common in-device memory 20 included in the logic device 2. However, this is not limiting. For example, the modules may access the memory 12 of the information processing apparatus 1. Alternatively, the modules may access a memory reconfigured in the static area R0 of the programmable logic circuit 21.

Figure 21:
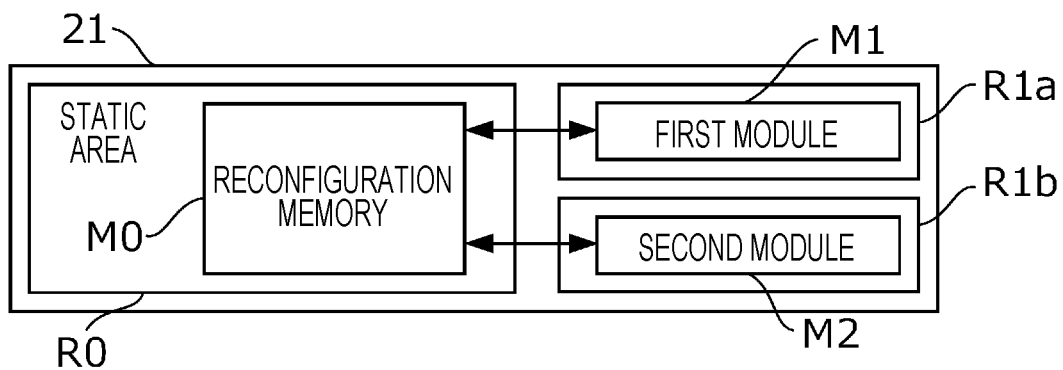
FIG. 21 is a diagram illustrating an exemplary programmable logic circuit according to a modified example.

FIG. 21 is a diagram illustrating an exemplary programmable logic circuit 21 according to the fourth modified example. The programmable logic circuit 21 illustrated in FIG. 21 reconfigures a reconfiguration memory M0 in the static area R0. Both the first module M1 reconfigured in the reconfiguration area R1*a* and the second module M2 reconfigured in the reconfiguration area R1*b* access the reconfiguration memory M0 which is a common memory reconfigured in the static area R0. The static area R0 also includes multiple logic blocks 211. That is, the reconfiguration memory M0 is an exemplary memory reconfigured in any of the logic blocks. In this case, the programmable logic circuit 21 may cause the second module M2 to delay execution of the process so that the second time does not overlap the first time.

Fifth Modified Example

In the exemplary embodiment described above, the program executed by the processor 11 of the information processing apparatus 1 is an exemplary program for causing a computer, which includes a processor connected to a programmable logic circuit, to execute a step of reconfiguring multiple modules in the programmable logic circuit, a step of predicting a first time of memory access made by a first module, which is being executed, among the multiple modules, and a step of predicting a second time of memory access made by a second module, which is not being executed, among the multiple modules, and delaying start of execution of the second module from the start time point of execution of the first module so that the second time does not overlap the first time.

The program may be provided by storing the program in a computer-readable recording medium, such as a magnetic recording medium, for example a magnetic tape or a magnetic disk, an optical recording disk, for example, an optical disk, a magneto-optical recording medium, or a semiconductor memory. The program may be downloaded through a communication line such as the Internet.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A programmable logic circuit comprising:
a plurality of logic blocks that are connected communicatively,
wherein a plurality of modules are reconfigured in any of the plurality of logic blocks, and
wherein the plurality of modules include a first module that is being executed and a second module that is not being executed, and start of execution of the second module is delayed from a start time point of execution of the first module so as to obtain a state in which a first time at which the first module accesses a memory does not overlap a second time at which the second module accesses the memory.

2. The programmable logic circuit according to claim 1, wherein the first time and the second time are predicted.

3. The programmable logic circuit according to claim 1, wherein the memory is reconfigured in any of the plurality of logic blocks.

4. The programmable logic circuit according to claim 2, wherein the memory is reconfigured in any of the plurality of logic blocks.

5. The programmable logic circuit according to claim 1, wherein the first module comprises one or more first modules, and
wherein start of execution of the second module is delayed from the start time point of execution of any of the one or more first modules in accordance with a combination of the one or more first modules and the second module.

6. The programmable logic circuit according to claim 2, wherein the first module comprises one or more first modules, and
wherein start of execution of the second module is delayed from the start time point of execution of any of the one or more first modules in accordance with a combination of the one or more first modules and the second module.

7. The programmable logic circuit according to claim 3, wherein the first module comprises one or more first modules, and
wherein start of execution of the second module is delayed from the start time point of execution of any of the one or more first modules in accordance with a combination of the one or more first modules and the second module.

8. The programmable logic circuit according to claim 4, wherein the first module comprises one or more first modules, and
wherein start of execution of the second module is delayed from the start time point of execution of any of the one or more first modules in accordance with a combination of the one or more first modules and the second module.

9. The programmable logic circuit according to claim 1, wherein the second module includes:
a processing circuit that performs a given process;
an input/output circuit that inputs/outputs data from/to the memory, the data being used by the processing circuit;
a measurement circuit that measures a waiting time in which the first module causes the input/output circuit to wait to input/output the data; and
a delay circuit that delays start of the process in accordance with the waiting time measured by the measurement circuit, the process being performed by the processing circuit.

10. The programmable logic circuit according to claim 2, wherein the second module includes:
a processing circuit that performs a given process;
an input/output circuit that inputs/outputs data from/to the memory, the data being used by the processing circuit;
a measurement circuit that measures a waiting time in which the first module causes the input/output circuit to wait to input/output the data; and
a delay circuit that delays start of the process in accordance with the waiting time measured by the measurement circuit, the process being performed by the processing circuit.

11. The programmable logic circuit according to claim 3, wherein the second module includes:
a processing circuit that performs a given process;
an input/output circuit that inputs/outputs data from/to the memory, the data being used by the processing circuit;
a measurement circuit that measures a waiting time in which the first module causes the input/output circuit to wait to input/output the data; and
a delay circuit that delays start of the process in accordance with the waiting time measured by the measurement circuit, the process being performed by the processing circuit.

12. The programmable logic circuit according to claim 4, wherein the second module includes:
- a processing circuit that performs a given process;
- an input/output circuit that inputs/outputs data from/to the memory, the data being used by the processing circuit;
- a measurement circuit that measures a waiting time in which the first module causes the input/output circuit to wait to input/output the data; and
- a delay circuit that delays start of the process in accordance with the waiting time measured by the measurement circuit, the process being performed by the processing circuit.

13. The programmable logic circuit according to claim 5, wherein the second module includes:
- a processing circuit that performs a given process,
- an input/output circuit that inputs/outputs data from/to the memory, the data being used by the processing circuit;
- a measurement circuit that measures a waiting time in which the first module causes the input/output circuit to wait to input/output the data; and
- a delay circuit that delays start of the process in accordance with the waiting time measured by the measurement circuit, the process being performed by the processing circuit.

14. The programmable logic circuit according to claim 6, wherein the second module includes:
- a processing circuit that performs a given process;
- an input/output circuit that inputs/outputs data from/to the memory, the data being used by the processing circuit;
- a measurement circuit that measures a waiting time in which the first module causes the input/output circuit to wait to input/output the data; and
- a delay circuit that delays start of the process in accordance with the waiting time measured by the measurement circuit, the process being performed by the processing circuit.

15. The programmable logic circuit according to claim 7, wherein the second module includes:
- a processing circuit that performs a given process;
- an input/output circuit that inputs/outputs data from/to the memory, the data being used by the processing circuit;
- a measurement circuit that measures a waiting time in which the first module causes the input/output circuit to wait to input/output the data; and
- a delay circuit that delays start of the process in accordance with the waiting time measured by the measurement circuit, the process being performed by the processing circuit.

16. The programmable logic circuit according to claim 9, wherein the delay circuit calculates a delay time in accordance with the waiting time, the delay time being a time by which start of the process performed by the processing circuit is delayed, and
wherein the delay circuit delays start of the process by using the delay time already calculated, without calculation of a new delay time after a count of calculations of the delay time is equal to or greater than a threshold.

17. The programmable logic circuit according to claim 1, wherein, when any two or more modules among the plurality of modules access the memory with a conflict with each other, access to the memory is permitted to each of the two or more modules in accordance with a priority assigned to each of the plurality of modules.

18. An information processing apparatus comprising:
a processor that is connected to a programmable logic circuit,
wherein the processor is configured to:
- reconfigure a plurality of modules in the programmable logic circuit;
- predict a first time at which a first module accesses a memory, the first module being executed and being among the plurality of modules;
- predict a second time at which a second module accesses the memory, the second module being not executed and being among the plurality of modules; and
- delay start of execution of the second module from a start time point of execution of the first module so as to obtain a state in which the second time does not overlap the first time.

19. The information processing apparatus according to claim 18,
wherein the processor is configured to:
reconfigure the memory in the programmable logic circuit.

20. A non-transitory computer readable medium storing a program causing a computer to execute a process, the computer having a processor connected to a programmable logic circuit, the process comprising:
- reconfiguring a plurality of modules in the programmable logic circuit;
- predicting a first time at which a first module accesses a memory, the first module being executed and being among the plurality of modules; and
- predicting a second time at which a second module accesses the memory, the second module being not executed and being among the plurality of modules, and delaying start of execution of the second module from a start time point of execution of the first module so as to obtain a state in which the second time does not overlap the first time.

* * * * *